United States Patent [19]

Schmettow et al.

[11] Patent Number: 4,833,433

[45] Date of Patent: May 23, 1989

[54] MAGNET SYSTEM FOR NUCLEAR SPIN TOMOGRAPHY HAVING SUPERCONDUCTING COILS AND A COLD SHIELD

[75] Inventors: Dieter Schmettow; Guenter Ries, both of Erlangen, Fed. Rep. of Germany

[73] Assignee: Siemens Aktiengesellschaft, Berlin and Munich, Fed. Rep. of Germany

[21] Appl. No.: 184,510

[22] Filed: Apr. 21, 1988

[30] Foreign Application Priority Data

Apr. 27, 1987 [DE] Fed. Rep. of Germany ....... 3714017

[51] Int. Cl.$^4$ .............................................. H01F 7/22
[52] U.S. Cl. ................................. 335/216; 335/300; 335/301
[58] Field of Search ............... 335/214, 216, 299, 300, 335/301; 324/318, 319, 320

[56] References Cited

U.S. PATENT DOCUMENTS

| | | | |
|---|---|---|---|
| 4,291,541 | 9/1981 | Kneip et al. | 62/45 |
| 4,651,117 | 3/1987 | Kawaguchi et al. | 335/216 |
| 4,652,824 | 3/1987 | Oppelt | 335/216 |
| 4,694,269 | 9/1987 | Burnett et al. | 335/216 |
| 4,721,934 | 1/1988 | Stacy | 335/216 |

FOREIGN PATENT DOCUMENTS

| | | |
|---|---|---|
| 0156239 | 3/1985 | European Pat. Off. . |
| 1212626 | 3/1966 | Fed. Rep. of Germany . |
| 1763771 | 10/1971 | Fed. Rep. of Germany . |
| 3344047 | 6/1985 | Fed. Rep. of Germany . |

OTHER PUBLICATIONS

Standard Search Reports RS 78325 DE.
Cryogenics, Vol. 24, No. 2 (Feb. 1984), pp. 59–62.
Japanese Journal of Applied Physics, vol. 25, No. 6 (Jun. 1986), pp. L443–445.

Primary Examiner—George Harris
Attorney, Agent, or Firm—Kenyon & Kenyon

[57] ABSTRACT

A magnet system for a nuclear spin tomography installation contains annular superconducting coils for generating a magnetic background field and nonsuperconducting gradient coils. A hollow cylindrical thermal shield fits between the gradient coils and the superconducting coils. According to the invention, the thermal shield at the front faces is formed from tubular end pieces. The front faces have a greater specific electrical resistance than a tubular intermediate piece of the thermal shield that extends between the end pieces and cover at least the area of the gradient coils.

14 Claims, 1 Drawing Sheet

MAGNET SYSTEM FOR NUCLEAR SPIN TOMOGRAPHY HAVING SUPERCONDUCTING COILS AND A COLD SHIELD

BACKGROUND OF THE INVENTION

1. Field of the Invention

The invention relates to a magnet system of an installation for nuclear spin tomography with at least one pair of annular superconducting coils for generating a homogenous magnetic background field. At least the superconducting coils located at the two front faces of the magnet system are each electrically bridged with a protective circuit to guard against an unintentional transition to a nonsuperconducting state i.e., a quench. The nonsuperconducting coils form magnetic field gradients. A hollow cylindrical thermal shield of a nonsuperconducting material is arranged between the gradient coils and the superconducting coils and extends in the axial direction at least up to the two front faces.

2. Description of Related Art

In the field of medical technology, diagnostic methods that use image producing have been developed to particularly analyze a human body. Integral resonance signals of the nuclei of particular chemical elements of the body or a part of a body are analyzed through calculations or measuring techniques. An image formed from the distribution of spatial spin densities or relaxation times is similar to an x-ray tomograph obtained in computer tomography and can be reconstructed and calculated, respectively. Corresponding methods are known by the name "nuclear spin tomography," Nuclear Magnetic Resonance tomography or (NMR) tomography, also referred to as "Magnetic Resonance Imaging" (MRI) or "Magnetic Resonance Spectroscopy" (MRS) or "zeugmatography".

A precondition for nuclear spin tomography is a magnetic field generated by a background field magnet. This background field must be sufficiently homogenous within an examination or imaging region. The magnetic induction in this region can be several Tesla. Such magnetic inductions, however, can be economically generated only with superconducting magnets. A body or a part of a body is introduced into the examination area along an axis that generally coincides with the axis of orientation of the background magnetic field. This background field is superimosed by stationary or pulsed gradient fields. In addition, a special antenna device is required to excite the discrete atomic nuclei in the body into a precessional motion. The antenna briefly activates a high-frequency alternating magnetic field. If necessary, this antenna device can also act as a receiver for the high-frequency signals thus produced.

Larger superconducting magnets are used in, for example, installations for nuclear spin tomography. These larger magnets can store considerable amounts of energy, often in the MJ range. These magnets are particularly vulnerable during an unintentional transition from the superconducting operating state to a nonsuperconducting state. This transition is referred to as "quench" and initially occurs only in part of the magnet. The increased resistance and the low heat capacity of the superconducting coil conductors of the magnet following a quench cause these coils to heat rapidly. The specific resistance simultaneously increases which further accelerates the heating. The consequences are electrical overvoltages that stress the insulation and, in the event of a flashover, can lead to damage or destruction of the magnet.

Special measures are required to protect such superconducting magnets against damage or destruction through overheating and electrical flashovers. These measures can comprise, for example, subdividing the magnet into several discrete coils. These coils are additionally electrically bridged with their own protection circuit to further limit the voltage. Such protection circuits include ohmic protective resistors (cf. German Pat. No. 2,301,152), semiconductor diodes (cf. German Pat. No. 1,614,964) or arresters (cf. German Pat. No. 1,764,369).

The superconducting background field magnets that are used in a nuclear spin tomography installation can be composed of several pairs of discrete annular superconducting coils and thus have the form of a solenoid (c.f., for example, European Patent Application No. 105,565 or German patent application No. 3,344,047). These discrete superconducting coils advantageously can be electrically bridged with the quench protection circuits. In the event of a quench of a single coil, however, the currents of the coils of the magnet, generally connected in series, can show a strongly differing shape over time so that the otherwise symmetrical current and, consequently, also the field distribution become strongly asymmetrical. The same thing also happens in an interaction of the coils with their surroundings. Undesirable circular currents are induced in the walls surrounding a cryostat and particularly in the surrounding radiation and thermal shields. The radiation shields that face the examination area are preferably made of thick walled pipes comprising a good electrical conductor so as to obtain a high electromagnetic time constant and a corresponding reduction in the effects of eddy currents on the gradient fields. However, high quench-induced currents can produce a sum of axial forces in the range of several tons by acting together with the coil field. This force stresses the mechanical suspension or support of the superconducting coils. The greatest forces are generated in a quench of one of the front face coils of a multicoil system of the type often provided for nuclear spin tomography background field magnets.

SUMMARY OF THE INVENTION

The present invention improves the magnet system of the kind mentioned at the beginning by reducing the effects of the forces generated in a quench.

In the present invention, the thermal shield at the two front faces is made from tubular end pieces formed from a material with a specific predetermined electrical resistance that is greater than the specific electrical resistance of the materials at the operating tempratures of the shield. At least one intermediate tubular piece extends between the end pieces of the thermal shield and covers at least the area of the gradient coils.

This design of the magnet system locates the end pieces of the poorer electrically conducting material at least partially in the area of the front face superconducting coils. The eddy currents caused by a quench of one of these coils in the assigned end pieces of the thermal shield decrease. Another consequence is the limited effect of the forces on the thermal shield. Further, the intermediate piece of the thermal shield that spatially separates the area occupied by the gradient coils from the superconducting single coils comprises a material which is a good electrical conductor. A high electromagnetic time constant is thus advantageously ensured to facilitate compensation for the eddy currents. The penetration into the gradient field on the single superconducting coils, which would lead to increased coolant losses, is correspondingly limited.

An additional feature of the present invention comprises forming the thermal shield, comprising a good electrical conductor, of tubular end pieces at the two front faces. At least one tubular intermediate piece extends between these end pieces that cover at least the area of the gradient coils. The end pieces have slits that extend over their entire axial extent.

This design of the tubular end pieces of the thermal shield achieves practically the same advantageous effects achieved as with the previously mentioned choice of special material.

DETAILED DESCRIPTION

The magnet system of the present invention can be explained using known models. These models are known from background field magnets for image producing installations for nuclear spin tomography (cf., for example, European Pat. No. 0,011,335 or European patent application No. 0,056,691). These magnet systems contain at least one pair of single superconducting coils at front faces for generating a background magnetic field in the direction of the z-axis of a right angled x-y-z coordinate system. The background field is sufficiently homogeneous in a designated imaging area. The imaging area has a center M in which the origin of the coordinate system is assumed to lie. The magnet system should permit axial access to this homogeneous imaging area so that a body, such as a human body, can be examined by being introduced along the z-axis into the region of the fields. The background field magnets thus preferentially have single annular coils that exhibit rotational symmetry.

Figure 1:
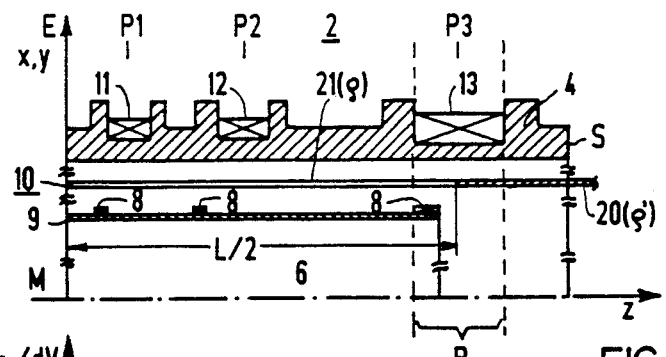
FIG. 1 shows one design of a magnet system according to the present invention showing a thermal shield.

The magnet system for nuclear spin tomography schematically shown in FIG. 1 uses a background field magnet 2 that has six discrete annular superconducting coils sequentially arranged along the z-axis. These discrete coils are symmetrically paired with respect to the plane E given by the x-y axis of the coordinates to produce three pairs P1, P2, and P3. FIG. 1 shows only the part that lie on one side of this plane of symmetry E and above the z-axis of the magnet system. Hence, only the inner coil pair P1 that faces the place of symmetry E is illustrated with its discrete coil 11. The outer coil pair P3 faces the front faces only with its discrete coil 13. The middle coil pair P2 lies in between and has discrete coil 12. The discrete coils of the magnet system 2 can be arranged, in particular, in corresponding grooves of a strong hollow cylindrical coil former 4 that is formed from a non-magnetic material. The discrete coils 13 of the front face coil pair P3 must have a significantly greater number of ampere windings that the discrete coils 11 and 12 of the two remaining coil pairs P1, P2 to ensure the necessary homogeneity required for nuclear spin tomography.

A cylindrical inner zone 6 of magnet system 2 is defined by the common coil former 4 by the coil pairs P1 to P3. In addition, known nonsuperconducting gradient coils and nonsuperconducting HF coils are arranged in the inner zone. FIG. 1 shows an example of saddle shaped x-y gradient coils 8.

The gradient coils 8 are, for example, fastened on a tubular carrier 9. The gradient coils are at room temperature which makes thermal shielding between them and the cold superconducting discrete coils 11 to 13 advisable. A ring shaped vacuum chamber serves this purpose. The vacuum chamber comprises at least a thermal shield 10. The tubularly shaped thermal shield must comprise a material that has sufficiently good thermal conductivity. The thermal shield 10 is maintained on a temperature level between room temperature of the gradient coils 8 and the lowest temperature of the superconducting single coils 11 to 13. To obtain this objective, it can be thermally coupled to parts of the magnet system that have an appropriate temperature of, for example, 50° K. or 80° K. In the present invention the thermal shield 10 is segmented in the axial direction into single tubular parts. The end pieces of each part that face the front face S are labeled 20. At least one intermediate piece 21 extends between the end pieces. The entire minimum axial extent L of the intermediate piece 21 is expediently chosen so that it at least largely shields the gradient coils 8 against the superconducting discrete coils 11–13. The intermediate piece 21 should only reach a region B or project into this region. This region is given by the axial extent of the front face coils 13 of the outer coil pair P3. In addition, the intermediate piece 21 is expediently made of a material having good electrical and thermal conductivity such as aluminum having a purity of 99.5%, which has a specific electrical resistance $\rho$ at 80° K. of approximately $3 \times 10^{-9} \Omega.m$.

In a first embodiment of the present invention, the front face end pieces 20 of the thermal shield 10 should be made of a material that has a comparatively significantly greater specific electrical resistance $\rho'$ at 80° K. than the material of the intermediate piece 21. The specific electrical resistance $\rho'$ at 80° K. of the material of the end piece should preferentially be at least 5 times greater, and preferably at least ten times greater. The aluminum alloy AlMg4,5, for example, is suitable, the $\rho'$ at 80° K. of which is approximately $3 \times 10^{-8} \Omega.m$.

The thermal shield 10 indicated in FIG. 1 can be built, for example, by joining the individual parts 20 and 21 directly by, for example, welding them together. These parts can also be arranged on or in a common hollow cylindrical carrier body of non-conducting material such as, for example, fiberglass reinforced with synthetic material. Moreover, it is also possible to provide a continuous carrier pipe of the poorly conducting material of the end pieces 20. In this embodiment at least one tubular intermediate piece 21 of the good conductor has an adapted diameter and is slid into place and subsequently fastened. In any event, sufficiently good thermal connection between the end pieces 20 and the at least one intermediate piece 21 should be ensured.

Figure 2:
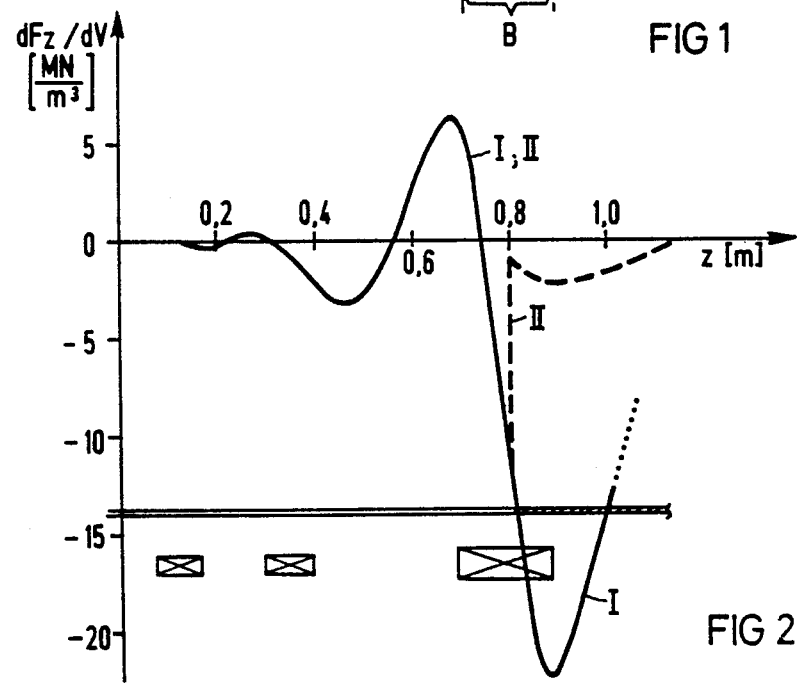
FIG. 2 shows an axial force density distribution on the thermal shield of the magnet system shown in FIG. 1.

An axial force density distribution produced by magnet system 2 in FIG. 1 is $dF_z/dV = j_\rho.B_r$. This force density distribution is shown in FIG. 2. Here, $F_z$ is the axial force, V the volume, $j_\rho$ the eddy current generated in the thermal shield and $B_r$ is the radical component of the magnetic induction in the x-y plane. The abscissa z uses the same scale as for the representation shown in FIG. 1. The associated force density distribution $dF_z/dV$ in the direction of the ordinate is plotted. A known 2 Tesla background field magnet was used as the basis with 3 pairs of P1 to P3 of superconducting discrete coils 11–13 having approximately 1.2 m inner diameter each. The thermal shield 10 has an inner diameter of approximately 1.1 m. These parts of the magnet system are also drawn in the Figure with their approximate axial positions and dimensions. If the thermal shield comprises an appropriate hollow cylinder that is not axially segmented in accordance with the invention, a pure aluminum wall having a thickness of 6 mm then provides a force density distribution 2.5 seconds after a quench of one of the front face superconducting end coils 13 which corresponds to curve I of the diagram. As can be seen from the shape of the curve, the force component $F_z$ that is generated at the time of the assumed quench point and the radial component $B_r$ change their sign along the thermal shield. A considerable maximum contribution of this components is then achieved in the vicinity of the axial end of this shield.

To avoid this result, the present invention makes the special end pieces 20 out of a material that is a poor electrical conductor to decrease the eddy current $j\rho$. Such a material may be, for example, AlMg4,5. Using the alloy AlMg,4,5 for the background field magnet can achieve a reduction of approximately 1/10. The force distribution that results from using special end pieces is shown in the diagram as dotted line II. This force coincides with curve I in the range $z \leq L/2$. The net force on the thermal shield at the assumed point in time is minimal given this force distribution.

Figure 3:
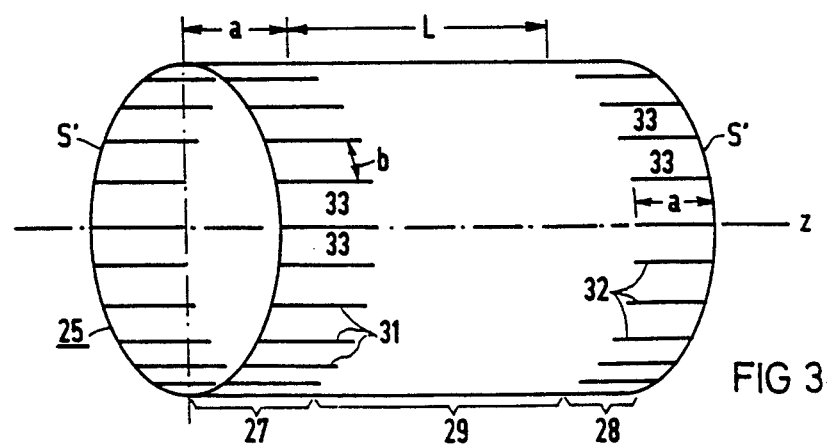
FIG. 3 shows an alternate design of a thermal shield for a magnet system according to the present invention.

The embodiment shown in FIGS. 1 and 2 assumes an axially segmented thermal shield 10 and that the tubular end pieces 20 have significantly lower electrical conductivity than the tubular intermediate piece 21 that lies between them. A corresponding effect can be achieved for this measure with respect to a suppression of the eddy currents induced in a quench and the forces associated with it. The end pieces are not made from any special material but rather are slit in a particular way. A corresponding design possibility for a thermal shield is schematically shown in FIG. 3 in an oblique view. The geometric dimensions of this tubular thermal shield, generally referred to as 25, and its individual segments correspond at least largely to those of thermal shield 10 (with parts 20, 21) according to FIG. 1. The thermal shield can advantageously have a uniform material over its entire axial length. The material should be a good electrical conductor such as pure aluminum. The front face and pieces 27 and 28 are slit but the intervening intermediate piece 29 of axial length L is not slit. The discrete slits 31 and 32 is from the direction of the front face S' of the shield 25 expediently extend largely at least axially in the z-direction. These slits determine the corresponding extent a of the end pieces 27, 28. The slits are uniformly distributed over the circumference of the particular end piece. Their number is preferably determined. The material of the thermal shield 25 remaining between adjacent slits forms then segments 33. The width b of each segment 33 in the circumferential direction is preferably chosen maximally equal to the axial extent a of the slits. Preferentially, a segment having a width $b \leq \frac{1}{2}$. a is provided. the lengths of the current paths are thus significantly increased and, consequently, the current induced in a quench correspondingly decreased.

What is claimed is:

1. A magnet system for a nuclear spin tomography installation, comprising:
   at least one pair of annular superconducting coils for generating a homogenous background magnetic field;
   a protective arrangement for bridging each of said pair of superconducting coils at two front faces of said magnetic system in the event that at least one of said coils unintentionally transists to a nonsuperconducting state;
   gradient coils that are nonsuperconducting for developing magnetic field gradients;
   a thermal shield formed from a hollow cylinder that axially extends between the gradient coils and the superconducting coils at least to the front faces of the magnet system, the thermal shield having a specific predetermined electrical resistance;
   tubular end pieces of the thermal shield at the front faces, the end pieces being formed from a material that has a first predetermined specific electrical resistance which is greater than a second prredetermined specific electrical resistance of the thermal shield at its operating temperature; and
   the thermal shield comprises at least one intermediate piece that is tubular and extends between the end pieces to cover at least the gradient coils said intermediate piece being made of a material having said second specific electrical resistance.

2. A magnet system as claimed in claim 1, wherein the first predetermined specific electrical resistance of the material comprising the end pieces is at least five times greater thanthe second specific electrical resistance of the material comprising the intermediate piece.

3. A magnet system as claimed in claim 1, wherein the first predetermined specific electrical resistance of the material comprising the end pieces is at least ten times greater than the second specific electrical resistance of the material comprising the intermediate piece.

4. A magnet system as claimed in claim 1, wherein the thermal shield comprises a continuous tube that extends to the front faces of the end pieces, in which the tubular intermediate piece is concentrically arranged.

5. A magnet system as claimed in claim 1, wherein the intermediate piece comprises aluminum of high purity and the end pieces comprise an aluminum alloy.

6. A magnet system for a nuclear spin tomography installation, comprising:
   a least one pair of annular superconducting coils for generating a homogeneous background magnetic field;
   a protective arrangement for bridging each of said pair of superconducting coils at two front faces of said magnetic system in the event that at least one of said coils unintentionally transists to a nonsuperconducting state;
   gradient coils that are nonsuperconducting for developing magnetic field gradients;
   a thermal shield formed from a hollow cylinder that axially extends beween the gradient coils and the superconducting coils at least up to the front faces of the magnet system, the thermal shield being made of a material that is a good electrical conductor;
   tubular end pieces at the two front faces, the end pieces having slits cut over their entire axial extent; and at least one intermediate piece that is tubular extending between the end pieces and covering at least the gradient coils.

7. A magnet system as claimed in claim 6, wherein the slits in the end pieces are of such number and uniformly distributed over a circumference as to form segments having a width remaining in the circumferential direction of the end pieces that is maximally equal to the axial extent of the slits.

8. A magnet system as claimed in claim 7, wherein the width of the segments is maximally one half of the axial extent of the slits.

9. A magnet system as claimed in claim 6, wherein the thermal shield has slits worked into it from the direction of the front faces.

10. A magnet system as claimed in claim 1, wherein the intermediate piece axially extends to a particular region given by the axial extent of the particular superconducting coil.

11. A magnet system as claimed in claim 1, wherein the intermediate piece extends into the vicinity of the axial center of the particular region at its two axial ends.

12. A magnet system as claimed in claim 6, wherein the intermediate piece axially extends to a particular region given by the axial extent of the particular superconducting coil.

13. A magnet system as claimed in claim 12, wherein the intermediate piece extends into the vicinity of the axial center of the particular region at its two axial ends.

14. A magnet system as claimed in claim 1, wherein the thermal shield comprises a continuous tube that extends to the front faces of the end pieces, around which the tubular intermediate piece is concentrically arranged.

* * * * *